(12) United States Patent
Albinsson et al.

(10) Patent No.: US 6,399,894 B1
(45) Date of Patent: Jun. 4, 2002

(54) WIRE BOND COMPENSATION

(75) Inventors: Björn Albinsson, Göteborg; Roy Bergqvist, Partille; Sandro Vecchiattini, Göteborg, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/467,906

(22) Filed: Dec. 21, 1999

(30) Foreign Application Priority Data

Dec. 22, 1998 (SE) ................................. 9804509

(51) Int. Cl.⁷ ................................. H05K 1/16
(52) U.S. Cl. ...................................... 174/260
(58) Field of Search ................. 174/260, 257, 174/259, 52.4; 361/767, 768, 771, 773, 774, 776

(56) References Cited

U.S. PATENT DOCUMENTS

| | | | |
|---|---|---|---|
| 5,449,951 A | * | 9/1995 | Parthasarrathi et al. ..... 257/677 |
| 5,521,406 A | * | 5/1996 | Tserng et al. ................ 257/276 |
| 5,815,427 A | * | 9/1998 | Cloud et al. ................... 365/51 |
| 6,028,348 A | * | 2/2000 | Hill ............................. 257/666 |

FOREIGN PATENT DOCUMENTS

| | | |
|---|---|---|
| EP | 0803907 | 10/1997 |
| EP | 0872890 | 10/1998 |
| JP | 5-291347 | 11/1993 |
| JP | 9-17918 | 1/1997 |
| JP | 9-232469 | 9/1997 |

OTHER PUBLICATIONS

International Search Report Request No. SE 98/01507.

* cited by examiner

*Primary Examiner*—Brian Sircus
*Assistant Examiner*—Javaid Nasri
(74) *Attorney, Agent, or Firm*—Burns, Doane, Swecker & Mathis, L.L.P.

(57) ABSTRACT

A hybrid circuit and a process for the manufacturing of a hybrid circuit (11) have been provided, the circuit comprising a component (2) such as a monolithic integrated circuit, MIC, and a substrate (1), being arranged on a common carrier plate (6), the substrate and component having respective terminals (3, 3', 4, 4', 4"). The hybrid circuit furthermore comprises a pad (7, 7', 7", 12, 13) mounted on the substrate terminal (3, 3'), whereby the pad is extending over the edge of the substrate terminal and facing the terminal (4, 4', 4") of the component, and at least one bonding element (8, 8', 8") or other connecting element being provided between the terminal (4) of the component and the pad (7, 7', 7", 12, 13). The connection according to the invention provides for a very low impedance value, which can be produced accurately, reliably and economically.

14 Claims, 2 Drawing Sheets

WIRE BOND COMPENSATION

This application claims priority under 35 U.S.C. §§119 and/or 365 to 9804509-9 filed in Sweden on Dec. 22, 1998; the entire content of which is hereby incorporated by reference.

FIELD OF THE INVENTION

The present invention is directed to a connection of a terminal of a high frequency (HF) component and a terminal of an adjacent substrate, whereby the high frequency component and the substrate are being mounted on a common carrier. Moreover, the invention is directed to a process for accomplishing such a connection and a hybrid circuit having such a connection.

More specifically, the invention concerns a wire bond connection between an electrical terminal of a monolithic integrated circuit (MIC); especially a microwave monolithic integrated circuit (MMIC), and a terminal of the substrate. The substrate terminals could serve so as to connect the terminals of the MIC to electrical components or circuits mounted on the substrate or other peripheral devices.

BACKGROUND OF THE INVENTION

In order to avoid signal losses and high frequency signal deterioration and in order to ensure good mechanical stability of wire bonding connections used in connection with monolithic integrated circuits, it is of high importance to keep the length of the bond wires as small as possible.

However, current production methods are associated with relatively wide tolerances for the distance between the MIC and the substrate. In order to accomplish a certain success rate using current mass production methods, this distance is chosen to include a certain safety margin.

Consequently, the functionality of the high frequency circuitry of demanding applications may be adversely affected or special measures will have to be implemented in the actual electrical circuit so as to compensate for the adverse electrical characteristics induced. This again, is likely to increase the cost of the product.

In prior art document EP-A-0 803 907 the problems of unwanted inductances or discontinuities of impedances appearing in bonding wires, or circuit parts associated with bonding wires, have been dealt with.

According to the above document various solutions have been proposed, which focus on providing a range of pre-fabricated bonding elements with various characteristics. From this range of bonding elements, denoted ribbons, an appropriate bonding element having a certain predetermined inductance or impedance that match the given application is selected.

The bonding elements according to the above document are formed like ribbons having various protrusions, width variations or curvature, which result in varying impedance values.

It is understood that the above bonding elements do not provide for a limitation of the production tolerances involved, but seeks to provide a remedy for alleviating or obviating the adverse electrical effects which would have been induced had bonding wires of a standard configuration been used.

The fact that a variety of different elements must be handled during the mounting process according to EP-A-0 803 907, implies that it is complicated and expensive to automate this process. It should be noted that the desired precision by which the impedance value of the connection can be achieved, i.e. the desired resolution in impedance values, would depend on the actual number of different bonding elements, which can be provided.

A general problem with ribbons is that in order to achieve an acceptable impedance value (capacity value per length unit) it is typically required that the width of the ribbon must exceed the width of the substrate terminal. This involves some design constraints.

A further disadvantage is that the ribbon must be positioned relatively precise with respect to the terminals. The position must be determined in accordance with the given geometrical variations occurring for the terminals. For determining the correct position of the ribbon, the two-dimensional properties of both terminals for a given connection must be assessed and the correct position must be determined on this assessment. This is complicated to implement in an automated process.

Moreover, the use of the bonding elements according to the above document implies that the impedance of the final connection must be estimated before a particular suitable bonding element can be selected and mounted on the terminals. That is, the precision of the final coupling depends on how precise the estimation of the final coupling can be made.

The properties of the final coupling may be difficult to assess, because it involves gaining precise knowledge of the geometry, which applies for a given set of terminals. Furthermore, the connection is difficult, if not impossible, to trim after it has been produced.

Prior art document JP-A-09017918, discloses a hybrid integrated circuit in which a semiconductor chip is mounted on a metal plate inserted in a through hole in a circuit substrate, the metal plate and substrate being mounted on a common radiation board.

According to the above document, the terminals of the hybrid integrated circuit are provided at the top of the substrate and disposed adjacent to the semiconductor chip.

Instead of mounting bonding wires directly on gold plating layers on the terminals of the substrate, which is a standard feature in the art, the above document teaches the use of a special bonding pad. Bonding wires are mounted at one end at this bonding pad and at the other end at the semiconductor chip.

According to the above document, conductive adhesive is used extensively except for on the connection between the radiation board and the circuit substrate.

The hybrid integrated circuit according to the above document ensures that the surface of the bonding pads are clean and free from flux whereby a reliable bonding of the bonding wire can be performed at the terminals of the semiconductor chip and the terminals of the substrate. This leads to an enhanced mechanical stability of the connection.

However, the impedance control obtainable according to the device disclosed in JP-A-09017918 is deemed to be at the same level as standard devices in which known wire bonding techniques are used.

Prior art document JP-A-232469 shows a number of terminals being provided with protruding bonding pads for obtaining minimum distances to terminals at fixed specific locations.

SUMMARY OF THE INVENTION

One object of the present invention is to set out a connection for a hybrid integrated circuit for which very small impedance values can be obtained accurately and cost effectively.

This object has been achieved by the subject matter defined in independent claim 1.

Another object is to achieve a manufacturing process, which accomplishes such a connection.

This object has been accomplished by the subject matter defined in claim 10.

It is furthermore an object of the present invention to accomplish a connection and a process for manufacturing such a connection in which the impedance of the connection can be controlled on an individual basis for each set of terminals.

This object has been accomplished especially according to the subject matter set forth in claims 2 and 11, respectively.

Further advantages will appear from the above discussion, and the following claims and description.

Among the further important advantages of the invention is that a connection of high mechanical stability has been provided.

DETAILED DESCRIPTION OF A PREFERRED EMBODIMENT OF THE INVENTION

Figure 1:
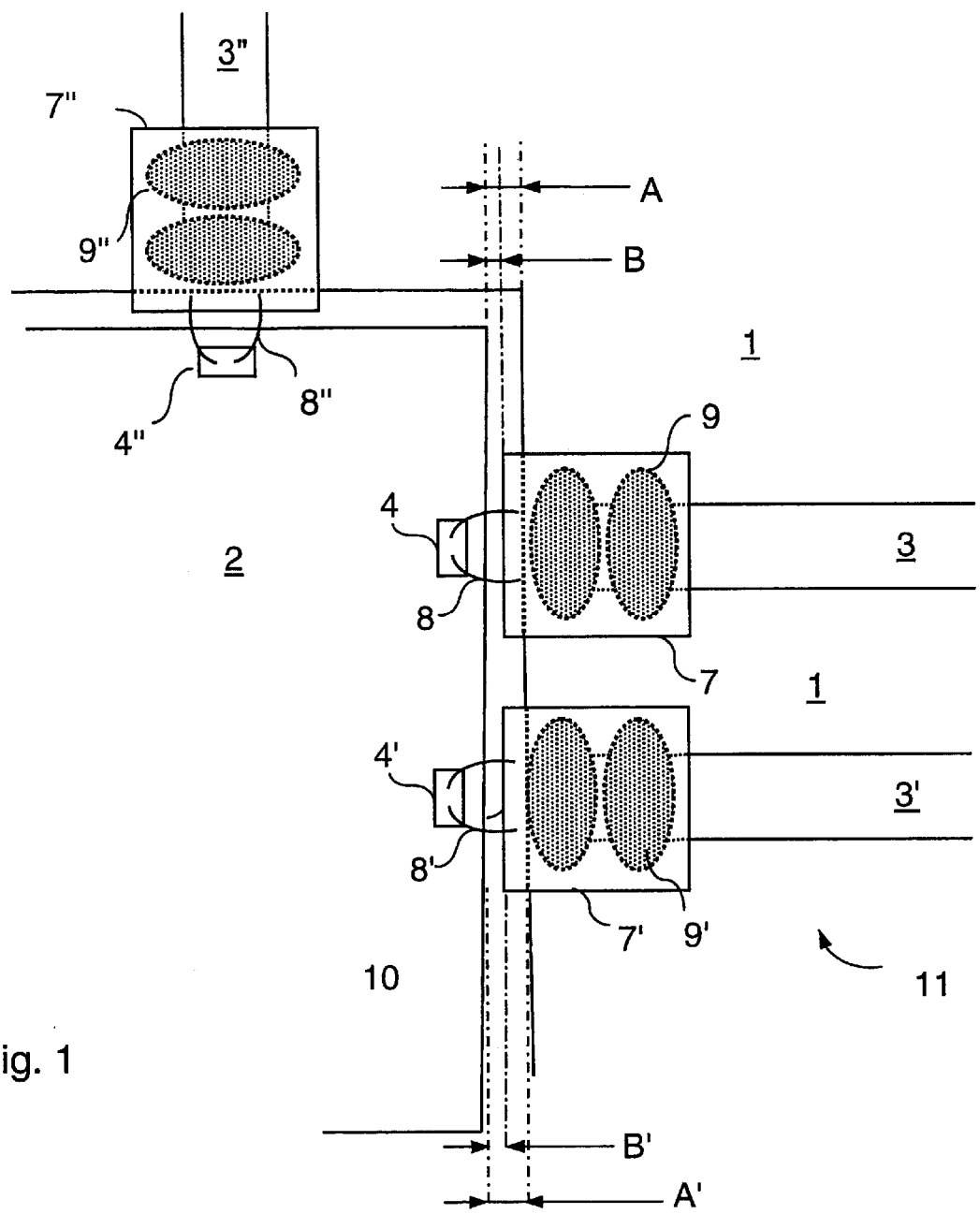
FIG. 1 is an upper view of the connection according to the present invention.
Figure 2:
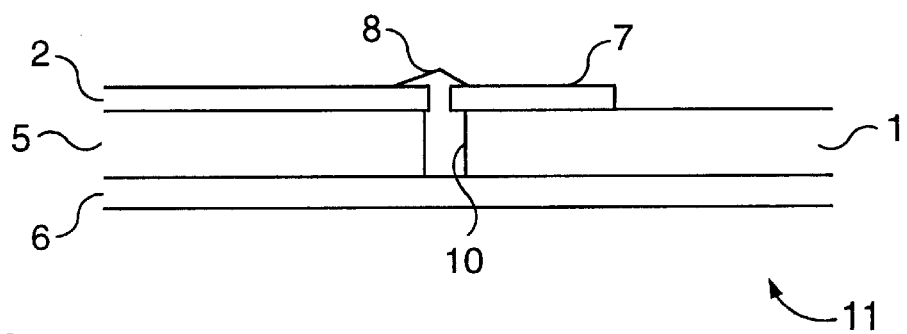
FIG. 2 is a side view of the invention corresponding to FIG. 1.

FIG. 1 and FIG. 2, which relates to the present invention, disclose a common carrier plate 6 on which there is mounted a substrate 1 and an adjacently disposed intermediate element 5 carrying a component 2, such as a monolithic integrated circuit (MIC) or a microwave monolithic integrated circuit (MMIC).

The common carrier plate 6 is for instance made of metal and provides a ground potential in relation to the circuit being formed on the substrate 1 and the component 2. The intermediate element 5 may be of metal for providing a good cooling effect of the component 2.

The substrate 1 may be constituted by a thin film or a thick film substrate, which is provided with conductors and terminals 3, printed on at least the top face of the substrate in question.

The substrate 1 may advantageously be made of a ceramic material, for instance materials sold under the brand names Duroid™ or TMM™. In addition, hybrid types of substrates, for instance having a metal basis and a ceramic layer, may be used.

The substrate 1 may be attached directly on the carrier plate 6 by solving or gluing. Alternatively, another intermediate element (not shown) may be arranged between the carrier plate 6 and the substrate 1.

The substrate 1 is provided with an end portion 10, which is arranged so as to face the component. In many applications, the end portion 10 of the substrate will be part of a hole or recess for receiving the component.

According to the present invention, on top of the substrate 1 over an electrical terminal 3 and extending over the edge of the substrate, there is mounted an electrically conductive pad 7, which is attached by e.g. an electrically conductive adhesive 9.

This pad 7 serves as a platform whereto the respective ends of one or more bonding elements 8 are attached. The other ends of the bonding elements 8 are attached to the terminal 4 of the component 2.

From FIG. 2, it appears that the height of the intermediate element 5 and the component 2 substantially matches the thickness of the substrate 1 and the pad 7 such that the surface of the pad substantially aligns with the surface of the terminals 4 of the component 2.

On FIG. 1, merely by example, two bonding elements 8 connecting the terminal 4 on the component and the terminal 3 on the substrate have been shown. This arrangement lowers the inductance of the coupling, but depending on the actual application, any number of bonding elements, including a single bonding element 8, could be used.

It should be understood that the bonding elements 8 are not only restricted to wires having a circular cross-section, although standard bonding wires having a circular cross-section are advantageous from a cost point of view.

As illustrated on FIG. 1, it is seen that the pad 7 extends over the edge of the end portion 10 of the substrate 1 and its terminal 3. It is also seen that the distance A between the opposing edges of the component 2 and the substrate terminal 3 is larger than the distance B between the edges of the component 2 and the pad 7.

The bonding wires generally have an inductive impedance value, while the pad contributes with a capacitive value. By matching these two components, the resulting impedance value of the connection can be rendered very low or selected to a desired predetermined value. For instance, the length and numbers of the bonding wires can be varied so as to match the impedance value of the pad.

Optionally, the impedance of the coupling could also be selected to a desired value by adjusting the distance B between the edge of the pad facing the component and the terminal of the component.

However for typical high frequency applications, it is desirable that the impedance of the connection is as small as possible. For this reason, the distance B is typically kept as small as the tolerance values allow it, such that the bonding elements can be made as short as possible. Short bonding elements are furthermore giving rise to an enhanced mechanical stability and reliability of the connection.

As stated above, the use of standard bonding wires in connection with a unitary pad design is particular advantageous from a cost point of view.

Moreover, since a bonding wire can be removed quite easily and replaced with a longer or shorter bonding wire or complemented with an additional bonding wire, it is possible to trim the impedance of the coupling after the circuit has been assembled (with single bonding wires on the terminals in question) and tests have been performed on the actual circuit.

As shown in FIG. 1, by way of example, three sets of terminals 3, 3', 3", 4, 4', 4" are connected by means of respective pads 7, 7', 7", bonding elements 8, 8', 8" and conductive adhesive 9, 9', 9". The edge of each respective pad 7, 7', 7" is arranged at an individually determined distance B and B' from the edge of the component 2 as seen from the respective pad. The latter distances B and B' are smaller than the respective prevailing distances A and A' between the substrate 1 edge and the component 2. The distances B and B" could also be controlled to be equal.

Process for Manufacturing the Above Connection

According to a preferred embodiment of the invention, the connection is produced by initially mounting the substrate 1 and the intermediate element 5 with the component 2 on the carrier plate 6. This can be done by means of a standard automated production process that requires a first tolerance level, which does not need to be particular high, as the placement of the component on the substrate is uncritical. As seen in FIG. 1, component 2 is placed at a certain distance A from the edge of the end portion 10 of the substrate 1.

Subsequently, the pad 7 is placed on the substrate 1 at a second enhanced tolerance level and attached to the terminal 3 in question, whereby the edge of the pad 7 is precisely aligned against the terminal 4 of the component at a certain distance B from the component 2. Advantageously, a conductive adhesive 9 is used to establish the connection.

This process step may be carried out by means of a specialised robot working with a high level of precision. The performance of this process step is independent of the actual shape of the edge of the end portion 10 of the substrate 1 and the placement of the component 2 in relation to the substrate 1.

In most cases, several terminals on the component and the substrate should be connected. The above step could be performed either sequentially by using a single robot on all terminals or by using a plurality of robots. According to the invention, each pad is positioned individually with the appropriate local distance B and B' from the component, independently from the locally prevailing distance A and A' between the edge of the substrate 3 and the component 2.

It can be difficult to assure a minimum distance especially for terminals being arranged opposite one another (not shown). However, according to the invention, a correct distance/impedance matching can be accomplished for all terminals.

The connection process is terminated by wire bonding the pad and the terminals of the substrate in question by for instance heat based, ultrasonic or thermosonic bonding.

It is seen that a relatively inaccurate positioning of the component in relation to the terminals of the substrate will not imply that the length between the corresponding terminals is reaching an excessive limit. Consequently, the impedance of the coupling can be controlled precisely.

According to the present invention, not only is the distance from the component to the substrate uncritical but the angular alignment of the component with regard to the substrate is also uncritical. According to the present invention, every single pad can be mounted with the desired local distance to the component. If needed, also the angular orientation of the pad can be controlled.

In addition, the quality or the smoothness of the edge of the end portion of the substrate facing the component is less critical according to the present invention compared to prior art designs. This means that the cutting of the substrate can be performed by a relatively simple process, which is not requiring as high a precision as would be the case had the pad according to the invention not been used.

It should be understood that the teaching of the present invention would be applicable to the connection of the terminals of any component. Thus, in the context of the present patent application, the term component could also be construed as another substrate comprising a circuit.

By adjusting the distance the pad 7 is arranged from the component 2 and/or the length of the bonding elements or by varying the number of bonding elements used, a given predetermined impedance value of a particular connection can be achieved.

It is understood that each individual connection in an actual application can be individually matched to the desired impedance value and produced at a very low cost.

Further Embodiments of the Invention

As stated above, the electrical characteristics of the coupling can be optimised by varying the design of the pad and o or varying the design of the bonding elements.

Figure 3:
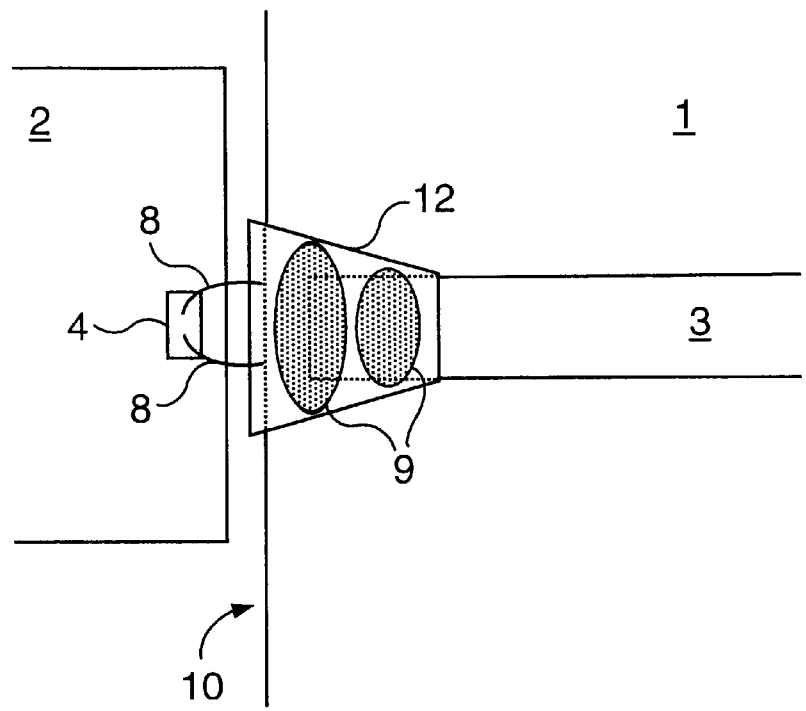
FIG. 3 is an upper view corresponding to FIG. 1 of a second embodiment of the invention.
Figure 4:
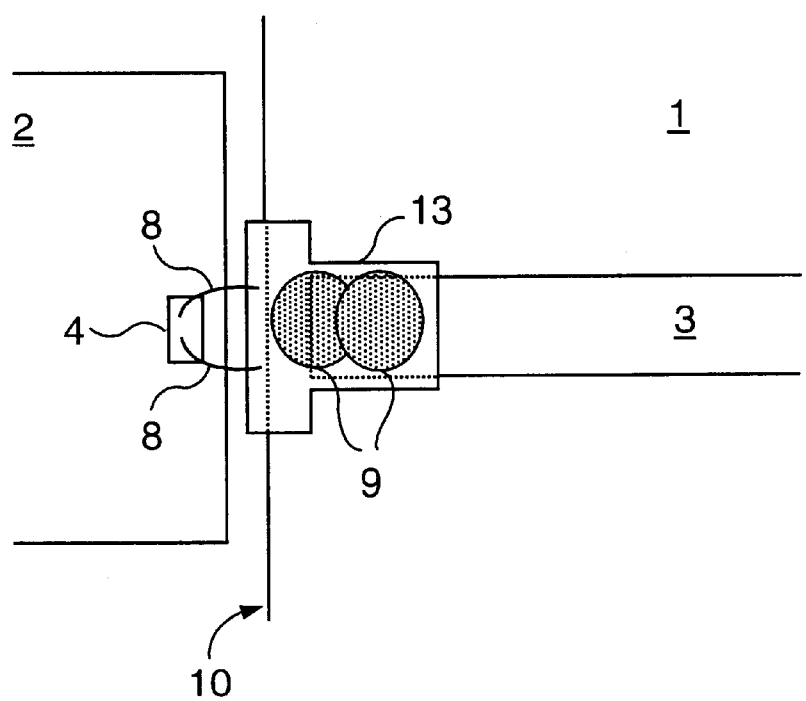
FIG. 4 is an upper view corresponding to FIG. 1 of a third embodiment of the invention.

FIGS. 3 and 4 show two further embodiments of the invention; more specifically differently designed pads resulting in varying impedance values and high frequency emission values, as placed on the substrate terminal.

The pad 12 according to FIG. 3 is designed so as to minimise the emission of high frequency radio waves emanating from the connection. The pad 12 has a form of a trapezium and is having one end of a first width matching the width of the conductor 3 and an opposing end having a broader Width. The pad 12 is placed such that the narrow end is facing away from the component and the broader end is facing the component.

The T-shaped pad 13 shown on FIG. 4 is associated with a higher capacitive value than the pad shown on FIG. 1. This coupling would therefore be useful for connections in which predominantly capacitive values of the connection are desired.

It should be noted that a number of different pads could be used within the same application, i.e. circuit.

It should also be noted that the variations in impedance values/radio emission properties that can be made according to the present invention would be higher than the number of pads used, because the pads can be combined with varying the positioning of the pads and varying the length of the bonding wires in a number of different ways. The distance B, B' the pads 7, 7', 7", 12, 13 are arranged from the component 2 can be varied. In addition, the length of the bonding elements 8, 8', 8" can be varied. Alternatively to, or in combination with the above options, the number of bonding elements 8, 8', 8" provided can also be controlled and determined individually for each respective substrate terminal 3, 3', 3" and component terminal 4, 4', 4" which should be connected.

| List of reference signs | |
| --- | --- |
| 1 | substrate |
| 2 | component |
| 3, 3' | substrate terminal |
| 4, 4', 4" | component terminal |
| 5 | intermediate element |
| 6 | carrier plate |
| 7, 7', 7" | pad |
| 8, 8', 8" | bonding element |
| 9, 9', 9" | electrically conductive adhesive |
| 10 | end portion |
| 11 | hybrid integrated circuit |
| 12 | pad |
| 13 | pad |

What is claimed is:

1. A hybrid integrated circuit comprising a substrate having a terminal and a component having a terminal, the substrate and the component being mounted on a common carrier plate, the circuit further comprising a pad mounted on the substrate terminal and at least one bonding element attached to the terminal of the component and a surface of the pad, the pad extending over an edge of the substrate terminal and the pad terminates with an edge facing the terminal of the component.

2. The hybrid integrated circuit according to claim 1, wherein the edge of the pad is arranged at a predetermined distance from an edge of the component, said predetermined distance being smaller than a distance between the substrate edge and the component edge.

3. The hybrid integrated circuit according to claim 2 wherein the bonding element has a circular cross-section.

4. The hybrid integrated circuit according to claim 1, wherein the pad accounts for a capacitive value and the at least one bonding element accounts for an inductive value, the pad and the at least one bonding element being chosen so that the impedance value of the resulting coupling has a predetermined value.

5. The hybrid integrated circuit according to claim 1, wherein the component is a monolithic integrated circuit.

6. The hybrid integrated circuit according to claim 1, comprising at least two substrate terminals and at least two component terminals, each respective substrate terminal being provided with a pad, the respective pads being individually arranged at a respective predetermined distance from the edge of the component as seen from the respective pad.

7. The hybrid integrated circuit according to claim 1, wherein the component is a monolithic integrated circuit.

8. The hybrid integrated circuit according to claim 1, wherein the pad is trapezium shaped.

9. The hybrid circuit according to claim 1, wherein the pad is T-shaped.

10. The hybrid integrated circuit according to claim 1, further comprising at least one intermediate element mounting the component to the common carrier plate.

11. The hybrid integrated circuit according to claim 10, wherein the intermediate element metal and is placed between the component and the common carrier plate.

12. A hybrid integrated circuit comprising a substrate having an electrically conductive terminal and a component having an electrically conductive terminal, the substrate and the component being mounted on a common carrier plate, the hybrid circuit further comprising a pad mounted on the substrate terminal, at least one bonding element provided between the terminal of the component and the pad, the pad extending over an edge of the substrate terminal and facing the terminal of the component, an edge of the pad is arranged at a predetermined distance from an edge of the component, said distance being smaller than a distance between the substrate edge and the component edge.

13. The hybrid circuit of claim 12, wherein the substrate comprises a dielectric material.

14. The hybrid circuit of claim 12, wherein the substrate comprises a ceramic material.

* * * * *